(12) United States Patent
Meyer (10) Patent No.: US 7,868,446 B2
(45) Date of Patent: Jan. 11, 2011

(54) SEMICONDUCTOR DEVICE AND METHODS OF MANUFACTURING SEMICONDUCTOR DEVICES

(75) Inventor: Thorsten Meyer, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 628 days.

(21) Appl. No.: 11/850,750

(22) Filed: Sep. 6, 2007

(65) Prior Publication Data
US 2009/0065927 A1    Mar. 12, 2009

(51) Int. Cl.
*H01L 23/488*   (2006.01)
*H01L 21/56*    (2006.01)

(52) U.S. Cl. .................................................. 257/693

(58) Field of Classification Search .................. 257/100, 257/433, 434, 667, 787–796, 738, 772, 693, 257/783, 687, 774, E31.117–E31.118, E51.02, 257/E23.116–E23.14, 666–677, E23.031–E23.059, 257/685–686, 723, 726, E25.031–E25.032, 257/E23.042; 438/15, 26, 51, 55, 64–67, 438/122, 124, 126, 127, 612–617
See application file for complete search history.

(56) References Cited

U.S. PATENT DOCUMENTS

| | | | |
|---|---|---|---|
| 6,118,179 A * | 9/2000 | Farnworth et al. | 257/734 |
| 6,441,500 B1 | 8/2002 | Sumikawa et al. | |
| 6,515,356 B1 * | 2/2003 | Shin et al. | 257/678 |
| 6,518,675 B2 | 2/2003 | Kim et al. | |
| 6,587,353 B2 | 7/2003 | Sumikawa et al. | |
| 6,713,880 B2 * | 3/2004 | Sahara et al. | 257/783 |
| 7,022,549 B2 | 4/2006 | Hedler et al. | |
| 7,071,027 B2 | 7/2006 | Seo | |
| 7,211,472 B2 | 5/2007 | Hedler et al. | |
| 7,265,449 B2 * | 9/2007 | Park et al. | 257/773 |
| 7,498,670 B2 * | 3/2009 | Farnworth et al. | 257/701 |
| 2004/0142505 A1 | 7/2004 | Huang et al. | |
| 2006/0012024 A1 * | 1/2006 | Lin et al. | 257/692 |
| 2006/0145344 A1 * | 7/2006 | Shimanuki | 257/737 |
| 2007/0069389 A1 | 3/2007 | Wollanke et al. | |
| 2007/0090528 A1 * | 4/2007 | Ikeda | 257/737 |
| 2007/0114642 A1 * | 5/2007 | Hosoyamada et al. | 257/676 |
| 2007/0164433 A1 * | 7/2007 | Bloom | 257/738 |
| 2009/0032964 A1 * | 2/2009 | Farnworth et al. | 257/774 |

FOREIGN PATENT DOCUMENTS

DE    10105351 A1    8/2002
JP    12031191 A     1/2000

OTHER PUBLICATIONS

Brunnbauer et al., Embedded Wafer Level Ball Grid Array (eWLB); 2006 Electronics Packaging Technology Conference, 1-4244-0665-X/06, IEEE, 2006 (pp. 1-5).

* cited by examiner

*Primary Examiner*—Dao H Nguyen
*Assistant Examiner*—Tram H Nguyen
(74) *Attorney, Agent, or Firm*—Dicke, Billig & Czaja, PLLC (57) ABSTRACT

This application relates to a semiconductor device comprising a semiconductor chip, a molded body covering the semiconductor chip wherein the molded body comprises an array of recesses in a first surface of the molded body, first contact elements, and elastic elements in the recesses that connect the first contact elements with the molded body.

20 Claims, 10 Drawing Sheets

SEMICONDUCTOR DEVICE AND METHODS OF MANUFACTURING SEMICONDUCTOR DEVICES

BACKGROUND

The present invention relates to a semiconductor device and methods of manufacturing semiconductor devices.

In the wake of an ever increasing level of function integration in semiconductor devices, the number of input/output channels of semiconductor devices has been rising continuously. At the same time, there is a demand to shorten signal channel lengths for high frequency applications, to improve heat dissipation, improve robustness, and to decrease manufacturing costs.

The introduction of Ball Grid Array (BGA) and other array connect technologies in the last 20 years has since helped the semiconductor packaging industry to meet many of the demands. Still, for this and other reasons, there is an ongoing effort to improve the array connect technologies.

SUMMARY

Accordingly, there is provided a semiconductor device comprising a semiconductor chip; a molded body covering the semiconductor chip, the molded body comprising an array of recesses in a first surface of the molded body; first contact elements; and elastic elements in the recesses that connect the first contact elements with the molded body.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

Although specific embodiments have been illustrated and described herein, it will be appreciated by those of ordinary skill in the art that a variety of alternate and/or equivalent implementations may be substituted for the specific embodiments shown and described without departing from the scope of the present invention. For example, while the embodiments may show solder balls as contact elements, it is well within the focus of the invention that the contact elements are other metallic elements that can be soldered or welded to electrical contacts of a substrate, or be made of conductive polymers or filled conductive polymers like isotropic conductive adhesives which are glued or coated with metal and soldered/ welded. Generally, this application is intended to cover any adaptations or variations of the specific embodiments discussed herein. Therefore, it is intended that this invention be limited only by the claims and the equivalents thereof.

Figure 1A:
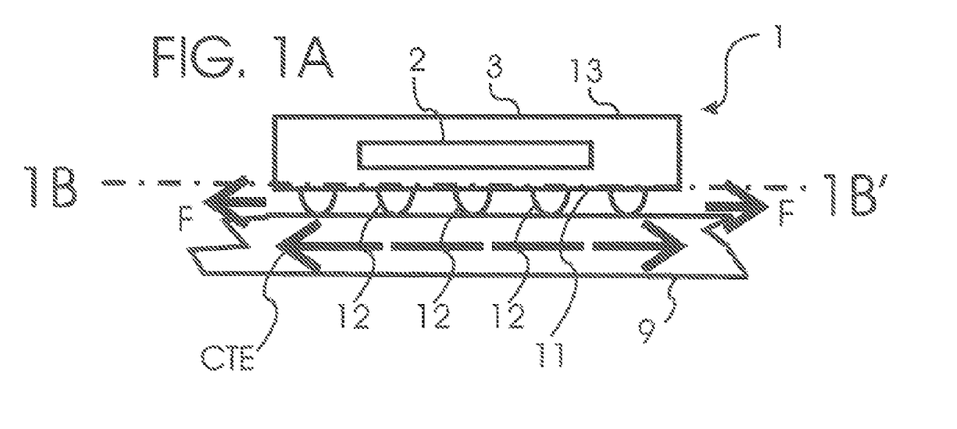
FIGS. 1A and 1B schematically disclose two views of cross sections of a semiconductor device soldered to a printed circuit board along the axes 1A-1A' and 1B-1B'.
Figure 1B:
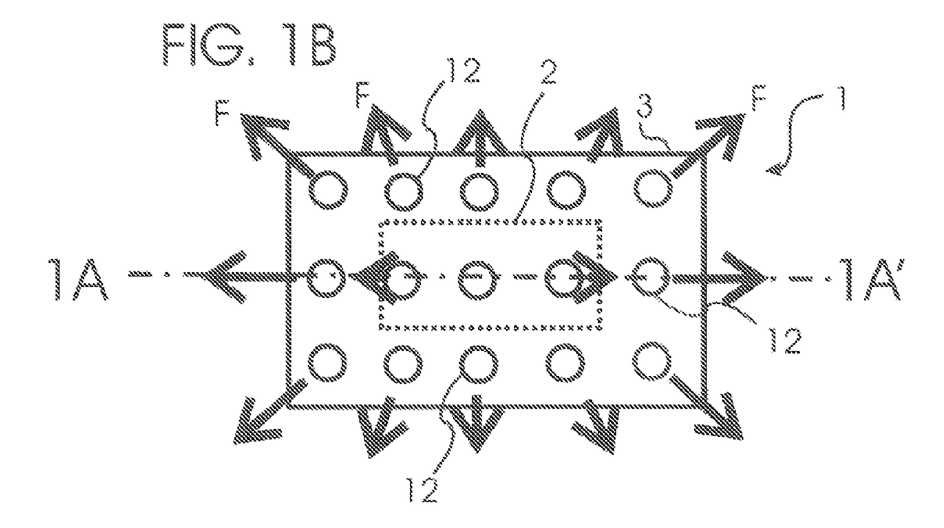

FIGS. 1A and 1B display schematic views of two orthogonal cross sections along the axes 1A-1A' and 1B-1B' through an electronic system consisting of a semiconductor device 1 soldered to a printed circuit board 9 (PCB) via an array of solder bumps 12. As can be seen, semiconductor device 1 is comprised of a semiconductor chip 2 that is packaged in a molded body 3, and a two-dimensional array of solder bumps 12 that connect the semiconductor device 1 to the printed circuit board 9. Typically, the molded body 3 is shaped to be of cubical shape having a flat first surface 11 facing the printed circuit board 9, an opposing second surface 13 facing away from the printed circuit board 9, and side faces connecting first and second surfaces 11, 13. The two-dimensional array of solder bumps 12 is attached to the flat first surface 11 of molded body 3. The use of a two-dimensional array of solder bumps on the first surface 11 facilitates a high input/output channel density.

The array of solder bumps 7 on the first surface 11 of the molded body 3 may serve two purposes: (a) if the solder bumps 12 are electronically connected to the integrated circuit in the semiconductor chip 2, the solder bumps 12 may provide the electrical connection between the integrated circuit and the circuit on the PCB 9, and (b) the array of solder bumps 12 provides a mechanical connection to rigidly hold the semiconductor device 1 to the printed circuit board 9.

FIGS. 1A and 1B also disclose mechanical forces, indicated by the arrows F, that act on the solder bumps 12 when printed circuit board 9 expands laterally at a higher rate than the semiconductor device 1 due to deviating coefficients of thermal expansion (CTE) of the materials involved. For example, the CTE of silicon is only $3 \times 10^{-6}$ 1/K while the CTE of a PCB is in the range of $17 \times 10^{-6}$ 1/K. Due to the CTE differences, temperature cycles of the semiconductor device during device operation may generate shear forces on the solder bumps that may break the solder bumps away from the molded body 3, which may cause the devices to fail. The lateral expansion of PCB 9 in FIG. 1A is indicated by a double-arrow labeled CTE. Of course, when cooling down the electronic system, the shear forces F are directed in reverse directions.

FIG. 1B, by the lengths of the arrows assigned to the various solder bumps 12, also indicates that the shear forces F are the larger the further away a solder bump is located away from the central solder bumps. This observation indicates that the risk of solder bumps breakage is the larger the larger the area of the solder bump array is. Further, the risk of solder bump breakage is highest for those solder bumps that are located at the outer edges of the solder bump array.

Figure 2A:
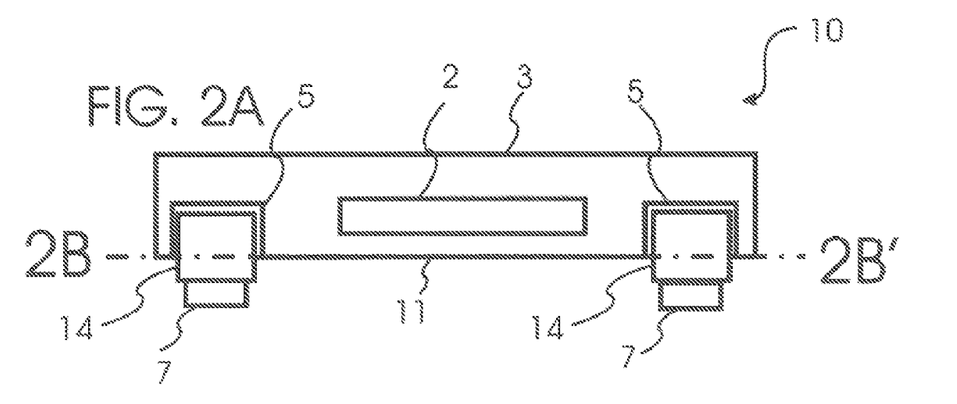
FIGS. 2A and 2B schematically disclose two orthogonal cross sections of an embodiment with first contact elements and elastic elements that connect the first contact elements with a molded body housing a semiconductor chip.
Figure 2B:
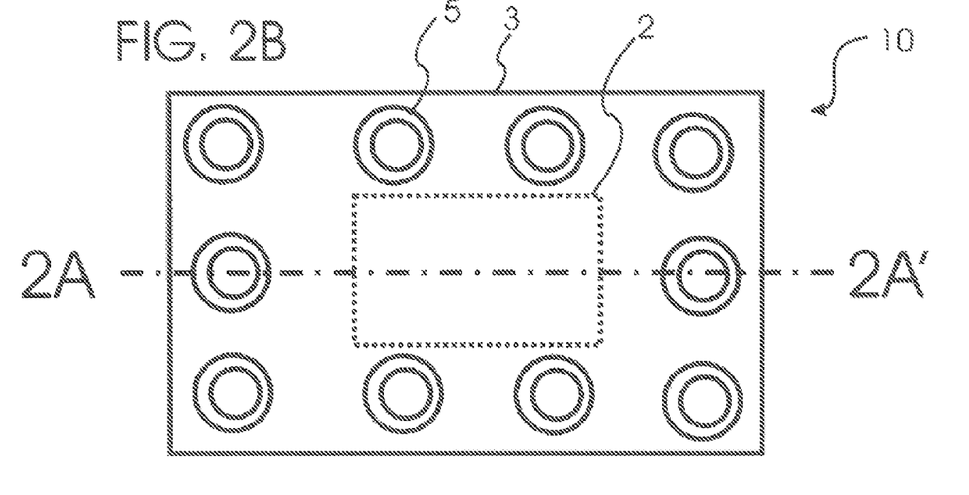

FIGS. 2A and 2B disclose schematic views on two orthogonal cross sections along the axes 2A-2A' and 2B-2B' of an embodiment of a semiconductor device 10 comprising a semiconductor chip 2, a molded body 3 that encapsulates the semiconductor chip 2, an array of recesses 5 formed in a first surface 11 of the molded body 3, first contact elements 7, and elastic elements 14 in the recesses 5 that each connect one of the first contact elements 7 with the molded body 3.

Semiconductor chip 2 may contain an integrated circuit, a sensor, a micro-electromechanical system (MEMS), optical components or any other functional device that is integrated into the semiconductor chip. Typically, the semiconductor chip 2 has a thickness of a few hundred micrometers and a lateral extension of a few millimeters, or centimeters, in lateral directions (see FIG. 2B).

As can be seen from FIGS. 2A and 2B, semiconductor chip 2 is fully encapsulated by molded body 3. Encapsulating semiconductor chips in a molded body helps protecting the sensitive surfaces of the chip from harming environmental influences, like humidity, scratches and chemicals. Typically, as will be explained later in more detail, molded body 3 has been formed from hot liquid molding material that has been introduced under pressure into a mold in which the chip 2 is inserted. During cooling, the molding material hardens to take on the shape of the mold.

In the case of FIGS. 2A and 2B, molded body 3 is a cubical with an array of ten column-like shaped recesses 5 on its first surface 11. Generally, first surface 11 is a flat surface that provides sufficient space for placing a two-dimensional array of first contact elements 7 thereon. Note that the term "array of recesses" may also refer to two-dimensional arrays that have missing elements therein. The mold material may be a polymer, e.g. an epoxy resin that, for CTE-adjustment, may contain a filling material, e.g. silicon oxide, and other components, like organic hardeners, release agents, adhesion promoters, flame retardants etc. The choice of the right molding material mixture, and the details of the molding process, depend on the application and are well known in the art.

The elastic elements 14 each mechanically connect one first contact element 7 with molded body 5. While the elastic elements may be made of electrically insulating material, the first contact elements 7 are made of conducting material to make electrical contact to the outside world, e.g., to a PCB board. Preferably, the first contact elements 7 are made of a metal or alloy that can be soldered or welded to the conducting lines of, say, a printed circuit board. For example, the first contact elements 7 may be layer elements made of copper or tin, solder bumps made of solder materials like Pb/Sn, and the like. First contact elements may be grown, deposited or placed on top of the elastic elements 14. With the elastic elements 14 between the molded body 3 and first contact elements 7, the shear forces between the semiconductor device 10 and the substrate to which the semiconductor device 10 is mounted (not shown in FIGS. 2A-B), can be absorbed to protect the first contact elements 7 from breaking away from molded body 3. As mentioned before in the context of FIGS. 1A and 1B, shear forces may arise on first contact elements 7 during device operation due to different CTEs of the semiconductor device and the substrate to which the substrate is mounted.

The recesses 5 in the molded body 3 provide a large interface area for the elastic elements 14 to be bond to. A large interface area ensures good adhesion of the elastic element to the molded body 3. Further, the inner walls of the recesses 5 that enclose the respective elastic elements 14 make sure that the elastic elements 14 cannot break from the molded body 3 when shearing forces act on the first contact elements 7. For this reason, it is useful if the elastic elements 14 are form-fit to the shape of the respective recesses.

Note that, depending on the depth, the circumference and shape of the recesses, the term "recess" may stand for many different types of recesses. They may be holes, cavities, trenches, depressions, openings, or through-holes that reach from one face 11 of the molded body 3 to the opposite other face 3 of molded body 3.

The elastic elements 14 may be a body of any material that is sufficiently elastic to prevent breakage of the first contact element 7 from the molded body 3 under thermo-mechanical or mechanical strain. Generally, it is preferred that the elastic module of the material is less than 50 MPa. For high reliability or large package sizes (e.g. larger than 40 mm$^2$) the elastic module may be below 15 MPa. Further criteria for the selection of the material of the elastic elements 14 may be: (a) good adhesion of the elastic element material to the molded body; (b) good adhesion of the first contact element material to the elastic elements; and (c) overall process compatibility of the elastic element material during the manufacturing of the semiconductor device. In the embodiment of FIGS. 2A and 2B, the elastic elements 14 are made of silicone which can have an elastic module of typically 3 MPa to 15 MPa and up to approximately 50 MPa. The elastic modulus of the resilient material can be chosen depending on the needed flexibility, reliability or package size. Ways of implementing the silicone elastic elements 14 into the recesses will be explained later in more detail.

The sizes of the elastic elements 14 generally depend on the contact element pitch requirements, and on the expected shear forces acting on the contact elements during manufacturing, mounting or device operation. The expected shear forces in turn depend on the size of the contact element array, on the diameters of the contact elements, on the CTE-values of the materials involved, etc. If the contact elements are solder bumps, the pitch between the solder bumps is typically in the range of 500-2000 micrometers, while the diameter of the solder bumps 12 is typically in the range of 300-1000 micrometers. Further, the elastic elements 14 that in FIGS. 2A and 2B have a column-like shape may have a column diameter that is larger than the diameter of the solder balls 12. This helps to mechanically decouple the solder bumps 12 from the molded body 3. At the same time, the columns are selected to be smaller than the pitch of the of the solder balls to avoid that neighboring elastic elements 14 touch each other. Further, the height of the elastic element columns in FIGS. 2A and 2B is about as large as the diameter of elastic element columns. However, there is no limitation to the height of the elastic element columns as long as the shear forces can be absorbed sufficiently.

It should be noted that in FIGS. 2A and 2B, about half the volume of each elastic element 14 protrudes from the first surface 11 of the molded body 3. By having the elastic elements 14 protrude from the first surfaces 11, the distance between the molded body 3 and the substrate (not shown in FIGS. 2A and 2B) to 5 which the semiconductor device is soldered is larger compared to systems where the elastic elements 14 do not protrude. A larger distance may help to absorb the shear forces better. This observation can be used to adjust the protrusion of the elastic elements 14 from the first surface 11 such that any given shear force requirement can be handled without that the solder bumps 12 break.

The first contact elements in FIGS. 2A and 2B may be lead free solder bumps. However, the first contact elements 7 may also be conducting layer elements made of any conductive material, e.g. metals or compounds like e.g. copper, tin, tin-lead or palladium, that can be soldered to a printed circuit board, metal balls made of copper, tin, conductive polymer or metal coated polymer, studs made of copper, aluminum or gold or posts made of copper or any other material, etc.

Figure 3:
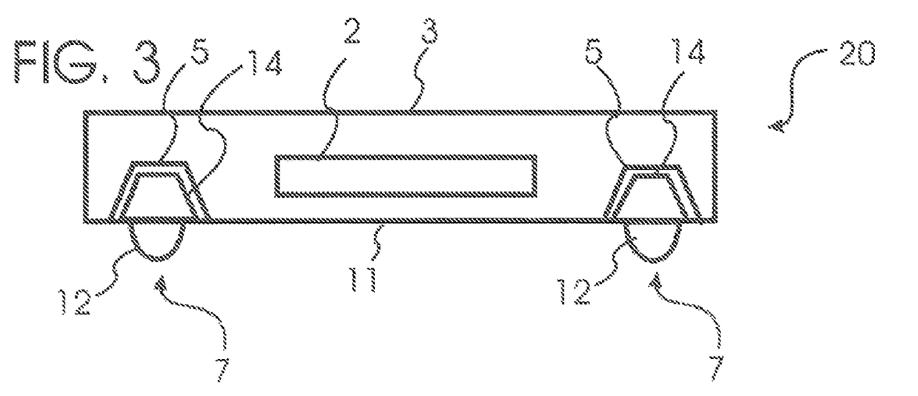
FIG. 3 schematically discloses an orthogonal cross section of a further embodiment with first contact elements and with elastic elements that connect the first contact elements with a molded body housing a semiconductor chip, whereby the elastic elements are flush with a first surface of the molded body.
Figure 4:
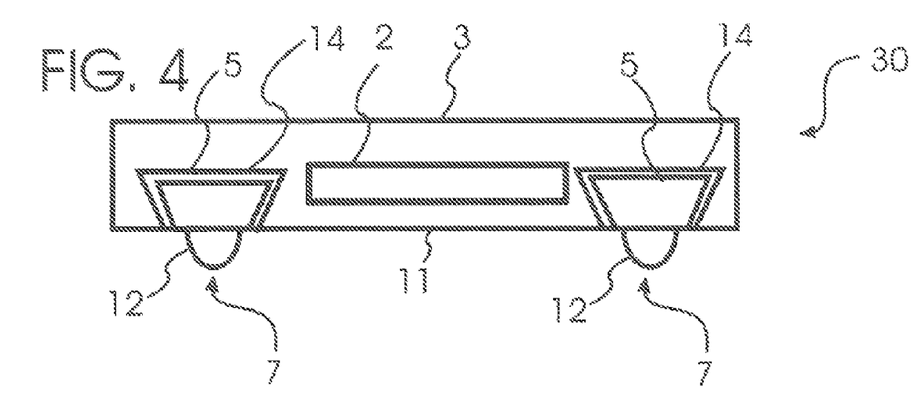
FIG. 4 schematically discloses a cross section of a further embodiment like in FIG. 3 with the difference that the elastic elements are mechanically interlocked with the recesses.

FIGS. 3 and 4 disclose cross sections of further embodiments of semiconductor devices 20, 30. The embodiment of FIG. 3 may be identical to the embodiment of FIGS. 2A and 2B with the difference that the elastic elements 14 are flush with first surface 11 of molded body 3. Having the elastic elements 14 flush with the first surface 11 enables an efficient way of manufacturing, as will be described later in the description.

Further, instead of the column-shaped elastic elements 14 in FIGS. 2A and 2B, the elastic elements 14 of semiconductor device 20 have a shape of a truncated cone with the base of the cone flush with first surface 11. One of the advantages of this geometry is that it is easy to implement the elastic elements 14 into the recesses 5. Further, the large area of the cone base is capable of holding a large contact element 12 without having the contact element 12 touch molded body 3. It is preferred that the first contact elements 7 are solder bumps 12.

The embodiment of FIG. 4 may be identical to the embodiment of FIG. 3 except that elastic elements 14, instead of having the truncated cone pointing upwards, point in a downward direction. An advantage of this geometry is that the elastic elements 14 are mechanically interlocked with the molded body 3. This way, the elastic elements 14 are securely tied to the molded body 3 to withstand strong shear forces.

The embodiments of FIGS. 3 and 4 are to illustrate only some of the many shapes that can be chosen for the elastic elements 14. Obviously, while the FIGS. 2A-B, 3 and 4 disclose recesses 5 and elastic elements 14 that have a rotationally symmetric cross section, recesses 5 and elastic elements 14 can also have cross sections that are squared, cubical or of any other shape appropriate for a given application or manufacturing process. Further, while there are advantages if the elastic elements 14 are form-fit to the shapes of the recesses, there may be circumstances where the elastic elements 14 fill the recess volumes only partially.

Figure 5A:
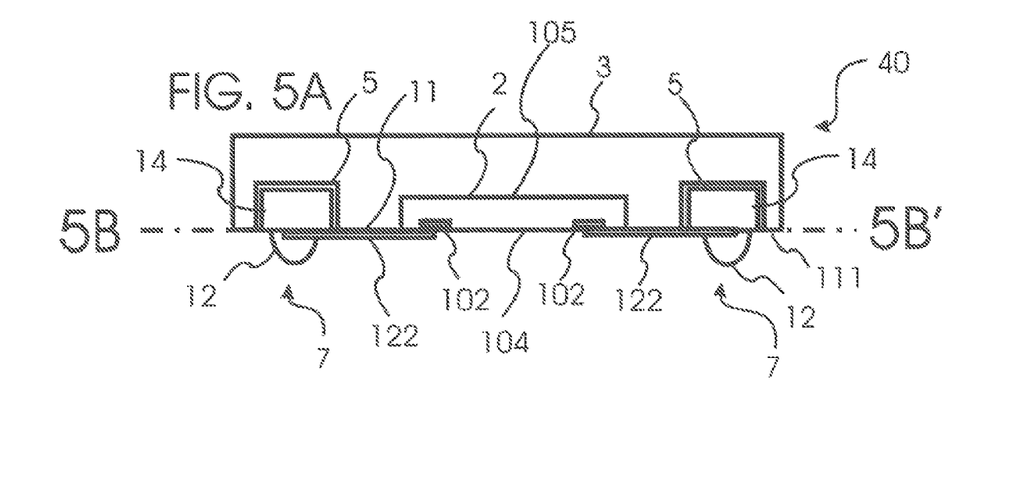
FIGS. 5A and 5B schematically discloses views of two orthogonal cross sections of a further embodiment disclosing conducting lines that electrically connect the first contact elements with the semiconductor chip.
Figure 5B:
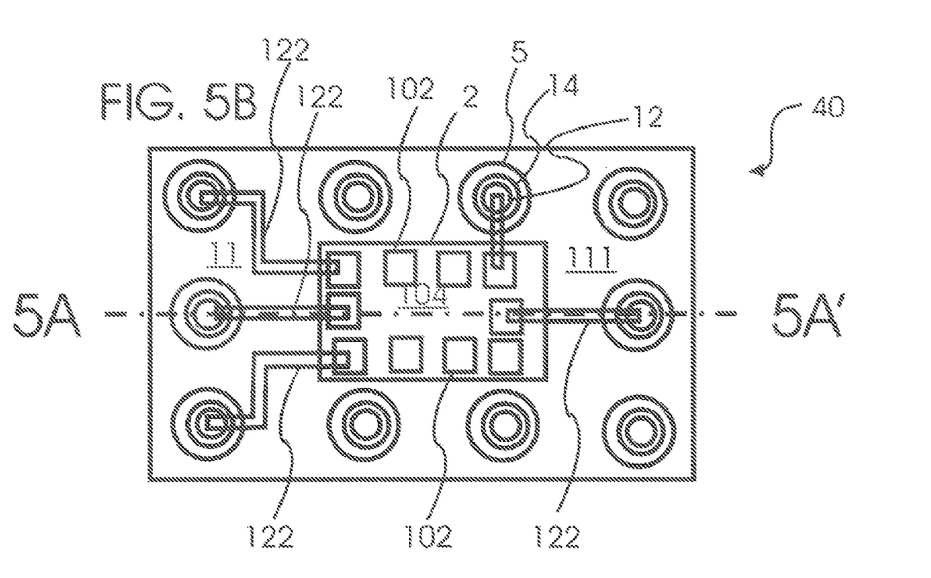

FIGS. 5A and 5B disclose schematic views on two orthogonal cross sections along the axes 5A-5A' and 5B-5B' of a further embodiment of a semiconductor device 40 comprising a semiconductor chip 2, a molded body 3 that encapsulates the semiconductor chip 2, an array of recesses 5 in a flat first surface 11 of the of the molded body 3. Further, semiconductor device 40 comprises first contact elements 7 and elastic elements 14 in the recesses 5 that each mechanically connects one of the first contact elements 7 with molded body 3. Shape and material of the molded body 3, solder bumps 12, semiconductor chip 2, and elastic elements 14 may be the same as disclosed in FIGS. 2A, 2B, 3 and 4. However, the embodiment of FIGS. 5A and 5B differs over the previous embodiments in that first main face 104 of the semiconductor chip 2 is left free of molding material. Instead, molded body 3 covers the second main face 105 and the side faces of semiconductor chip 2 only. This way, connection elements 102 are left free of molding material.

The embodiment of FIGS. 5A and 5B further differs over the previous embodiments in that first main face 104 of semiconductor chip 2 is flush with the elastic elements 14 and the planar first surface 11 of the molded body 3. This package design has several advantages, one of them being that elastic elements 14, first surface 11 of molded body 3, and active surface 104 of semiconductor chip 2 form a coplanar plane 111 on which conducting lines 122 can be formed that connect the connection elements 102 of the semiconductor chip 2 with solder bumps 12. Due to the planarity of coplanar plane 111, the conducting lines 122 can be formed using highly efficient, and precise, planar technology processes, like metal layer deposition, lithography, and selective etching. In particular, using planar thin-film technology, conducting lines with a minimum structure size of less than twenty micrometer in lateral dimensions and thicknesses below 1 µm, typically 1-7 µm can be formed. Such small nominal structure size enables a production of thousands of connection lines 122 connecting the connection elements 102 of semiconductor chip 2 to possibly thousands of contact elements 7 within one layer. The cross section of FIG. 5B, which is taken within coplanar plane 111, illustrates schematically the way in which five of the ten solder bumps 12 are electrically connected to respective five of the ten connection elements 102 on semiconductor chip 2.

Figure 6A:
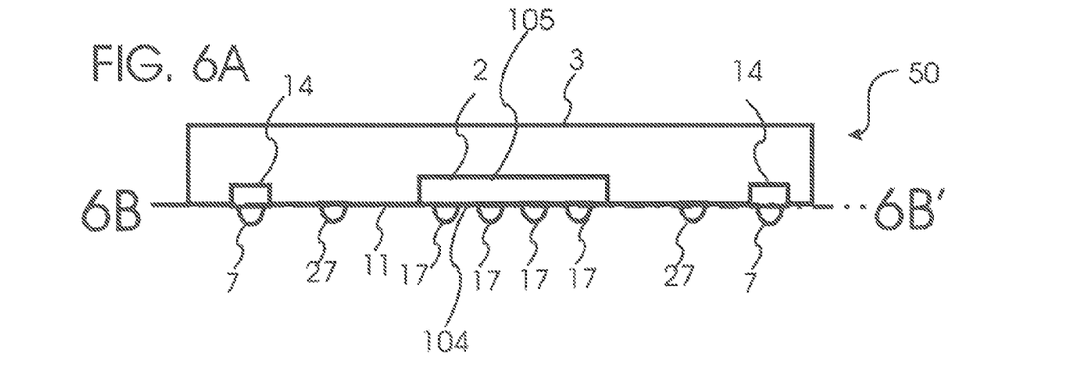
FIGS. 6A and 6B schematically disclose a further embodiment wherein the semiconductor chip comprises first contact elements that are connected to the molded body by means of elastic elements, and second contact elements that are rigidly connected to the semiconductor chip.
Figure 6B:
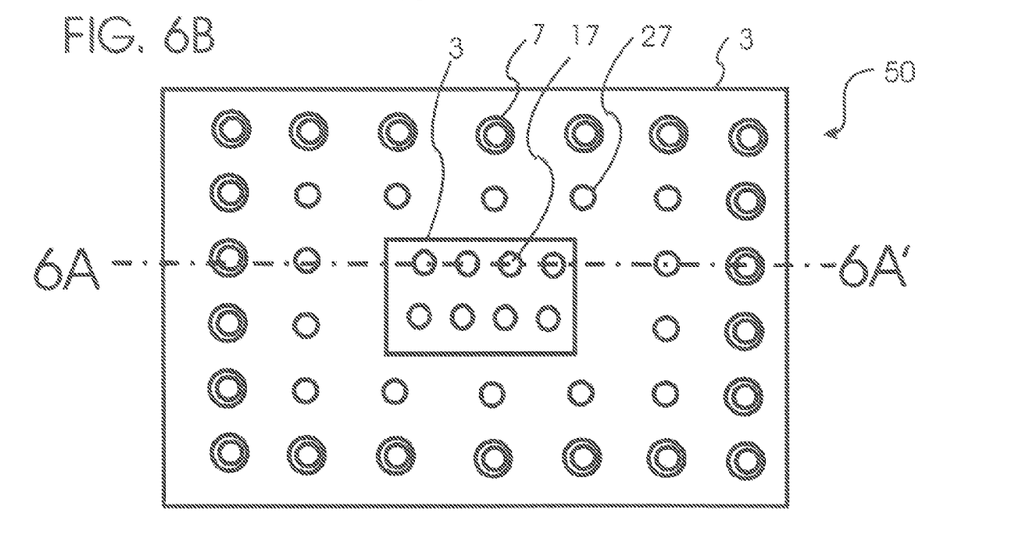

FIGS. 6A and 6B disclose schematic views on two orthogonal cross sections along the axes 6A-6A' and 6B-6B' of a further embodiment of a semiconductor device 50 that in many ways resembles that of FIGS. 5A and 5B. However, in addition to the first contact elements 7 that are elastically connected to the molded body by means of elastic elements 14, semiconductor device 50 also comprises second contact elements 17 that are rigidly connected to semiconductor chip 2. This way, the active chip area 104 (first main face of the chip) can be used for additional input/output channels.

Further, in addition to first and second contact elements 7, 17, semiconductor device 50 also comprises third contact elements 27 that in contrast to the other contact elements are rigidly connected to the molded body 3. Note that only the outer line and row of the array of contact elements is connected to elastic elements 14. This is because the thermo-mechanically generated shear forces on the contact elements are largest at the outer contact elements of a contact element array. Therefore, it may be sufficient to have only the outer contact element line and row of the array elastically connected to molded body 3 while in the central region of the array of contact elements, a rigid connection of the molded body 3 to the substrate may be preferred to provide for better system robustness.

Figure 7A:
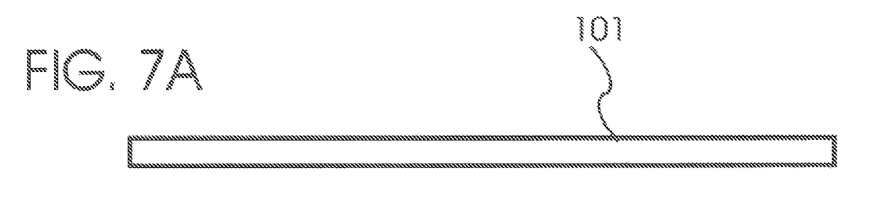
FIGS. 7A to 7H schematically disclose an embodiment of a method of manufacturing semiconductor devices wherein molding material is applied over semiconductor chips and over elastic elements.

FIGS. 7A to 7H disclose schematically an embodiment of a method of manufacturing semiconductor devices. FIG. 7A discloses a carrier 101 onto which semiconductor chips 2 and elastic elements 14 can be placed. In principle, carrier 101 may be any carrier that can be used as a basis for placing and molding semiconductor chips 2. For example, carrier 101 may be a bottom piece of a mold form, a foil on which the chips are positioned and molded, or a sticky tape with thermo-release properties.

For the present embodiment, we assume carrier 101 to be a double-sided sticky tape (not shown in FIG. 7A) with thermo-release properties that is laminated onto a flat plate. The double-sided stickiness of the tape makes sure that the tape is securely held by the flat plate, and that the individual semi-conductor chips 2 and elastic elements 14 can be securely placed onto predefined positions with high accuracy, e.g. with a spatial precision of about 10-15 micrometers (see FIG. 7B). Note that the individual chips 2 are placed onto the carrier 101 in an upside-down direction, i.e. the first main faces 104 of the chips 2 that comprise connection elements 102 (and the active region of the chip) are facing downwardly in a direction towards carrier 101. Usually, the chips 2 are taken from a processed and singulated wafer, picked by a pick-and-place automate, and placed on carrier 101.

Figure 7B:
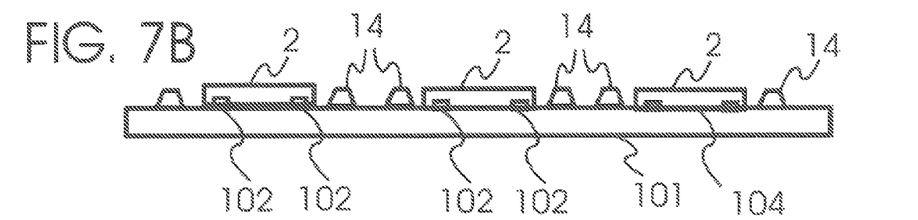

The elastic elements 14 in FIG. 7B are prefabricated elements made of silicone or any other elastomer. Alternatively, the prefabricated elements may be thermoplastic or thermosetting materials. Note that the elastic elements may be flexibilized by addition of flexible materials of the same or a different material family. The material can be a foam as well. In the present example, the elastic elements 14 have a truncated cone-like shape having a base diameter of, say, 500 micrometers and a height of, say, 200 micrometers. Typically the base diameter of the elastic element is larger (typically 10-20% larger) than the pad diameter to which the contact element is applied. For different package sizes the reliability can be adapted by adapting the size of the elastic elements. For small packages, the size of the elastic element is less than 10% larger than the pad (even smaller), for very large packages, the size of the elastic elements can be more than 20% larger than the pad. The thickness of the elastic element can range from 20 μm to chip thickness. With the cone-like shape, the elastic elements 14 have a sufficient base surface to securely adhere to the double-sided sticky tape of carrier 101. It can have any other form as well.

Figure 7C:
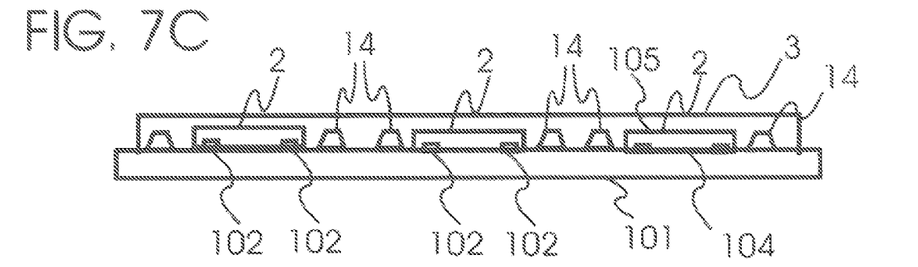

FIG. 7C schematically discloses the set-up of FIG. 7B after molding the semiconductor chips 2 in a compression molding process. In a compression molding process, a liquid molding compound, e.g. a polymer or resin etc., is dispensed over the semiconductor chips that are positioned on the carrier. Afterwards, a top cavity is moved downwardly towards the carrier to close the cavity, thereby spreading out the molding material until the cavity is filled completely. During the cooling of the molding material down to room temperature, the molded material hardens to become molded body 3.

FIG. 7C discloses molded body 3 covering the second main face 105 and the sides of the semiconductor chips 2 and elastic elements 14 but, due to the first main faces 104 of the semiconductor chip 2 securely attached to carrier 101, leaving the first main faces 104 and connection elements 102 free of molding material.

Generally, molded body 3 may have any shape. For the present embodiment, however, it is assumed that the molded body 3 has been shaped by a mold form with a cavity having a height and lateral extension of a standard semiconductor wafer. For example, the diameter may be 8 or 12 inches (200 mm or 300 mm), and the height may be typically 500 to 800 micrometers. With such size, molded body 3, the elastic elements 14 and the semiconductor chips 2 covered by the molded body 3 form a "reconstituted wafer" 160 on which, with standard wafer processing equipment, can be conveniently deposited or structured additional layers.

It should be noted that the molding can also be done by a more traditional method known as transfer molding, which is a widely used technique for the encapsulation of electronic devices. The principal of this technique is based on a thermally liquefied molding compound being transferred under pressure into a preformed cavity.

Figure 7D:
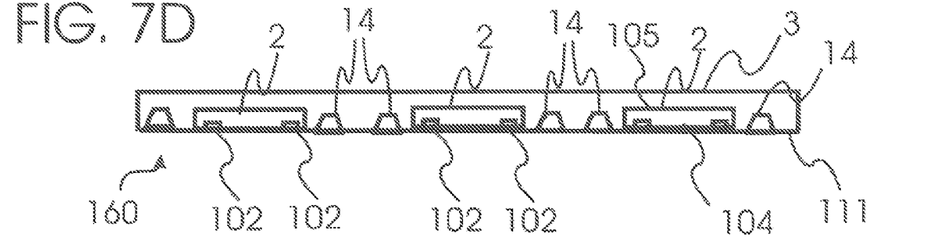

FIG. 7D schematically discloses molded body 3 after having released carrier 101 from molded body 3. The release may be conveniently carried out by heating the thermo-release tape. After release, the first main surface 104 of the semiconductor chip 2, the connection elements 102, as well as the bases of the elastic elements 14, are exposed to the outside as no molded material is covering the three. In particular, the exposed first main surface 104 of the semiconductor chip 2, the bases of the elastic elements 14, and the molded body 3 form a flat coplanar plane 111. As mentioned above, with the removal of carrier 101, molded body 3, the elastic elements 14, and the semiconductor chips 2 embedded in the molded body 3 form a "reconstituted wafer" 160.

Figure 7E:
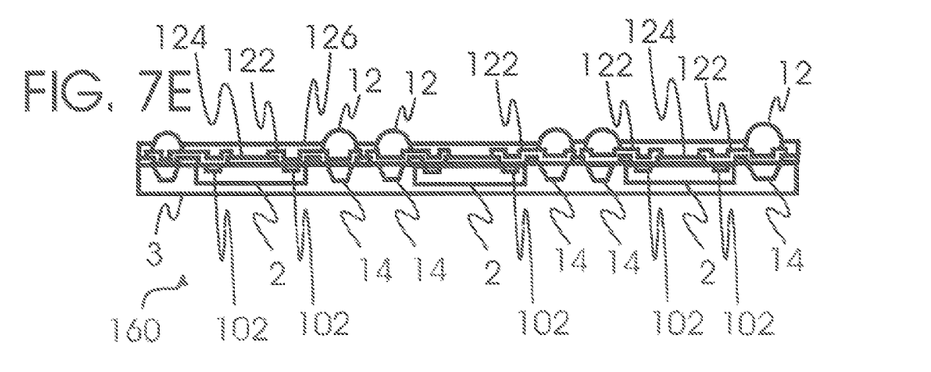

FIG. 7E schematically discloses reconstituted wafer 160, after having been processed to obtain solder bumps 12 on top of the elastic elements 14, and a redistribution layer that electrically connects the connection elements 102 of the semiconductor chips 2 to respective solder bumps 12. The redistribution layer in FIG. 7E is comprised of conducting lines 122 that provide for the electrical connections between the connection elements 102 and the solder bumps 12, elements of an insulation layer 124 that selectively insulate the surfaces of the semiconductor chips 2 from the conduction lines 122, and solder stop layer 126 for shaping the solder bumps 12 at the right positions.

Figure 7F:
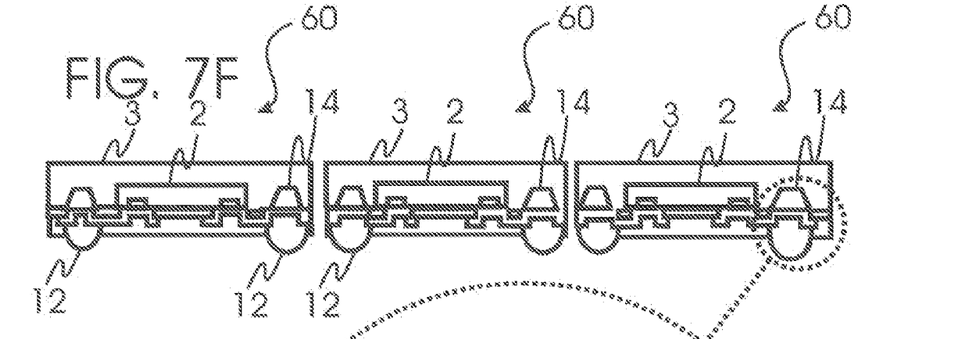

FIG. 7F schematically discloses molded body of FIG. 7E after having been sawn to separate reconstituted wafer 160 into separated semiconductor devices 60. The sawing process is a standard process well known in the art. Note that the sawing process is being performed after molding, and after application of the solder bumps 12 to the semiconductor devices 60. This way, it is possible to carry out the molding process and the solder bump application on a wafer level, i.e. as a batch process where many semiconductor devices are manufactured in parallel.

Figure 7G:
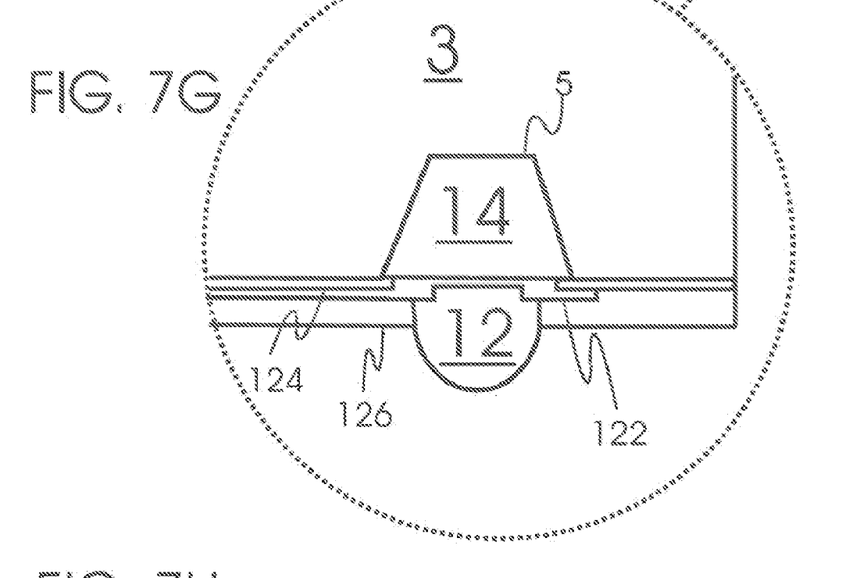

FIG. 7G discloses a section of the embodiment of FIG. 7F magnified to schematically illustrate the structure of the molded body 3 of FIG. 7F in the vicinity of the elastic elements 14 in more detail. As can be seen from FIG. 7G, elastic element 14 is form-fit to recess 5 of molded body 3 so that the boundary of recess 5 and elastic element 14 coincide. This is due to the fact that the elastic elements 14 have been placed onto carrier 101 before liquid molding material was applied over semiconductor chips 2 and elastic elements 14. The liquid molding material was able to enclose the elastic elements 14 in a form-fit manner.

FIG. 7G further discloses that the base of the cone-shaped elastic elements 14 and the lower face of the molded body 3 are flush with each other. This is due to the fact that elastic elements 14 (and the semiconductors chips 2) were placed on a flat carrier before molding material was applied over the elastic elements 14 and the semiconductor chips 2. FIG. 7G further discloses that, after separating the carrier 101 from molded body 3, an insulation layer 124 was applied over the surface of molded body 3 and the semiconductor chips 2. Insulation layer 124 is to electrically insulate the conducting lines 122 from the semiconductor chip 2 wherever needed. In this embodiment, insulation layer 124 has been applied and structured on the wafer level, typically by using thin-film techniques, but printing or jetting technologies would be possible as well. Thin film techniques, by use of sputtering processes, spin-on processes, vapor deposition, photolithography, etching, and other known processes, enable manufacturing of very fine structures on a wafer. Typically, the minimum structure size of insulation layer 124 may be as low as 10-20 micrometer (lateral size), while the thickness of the insulation layer 124 is in typically in the range of 5 to 15 micrometers. Materials that are used for the insulation materials are polymers, like polyimide, epoxies, BCB or PBOs or other known dielectric materials. In the case of FIG. 7G, the insulation layer 124 has been opened in the regions of the connection elements 102 of the semiconductor chips 2, and in the regions of the elastic elements 14.

FIG. 7G further discloses conducting lines 122 applied on insulation layer 124. The conducting lines 122 have been etched from a layer of conducting material, e.g. aluminum, copper, or stacks of metals, e.g. CuNiAu. The thickness of the conducting lines is typically 1 to 7 micrometers. The conducting lines 122 fully cover the openings in the insulation layer 12. This way, a good electric connection is made between the connection elements 102 of the semiconductor chips 2 and the respective conducting line 122. Further, as shown in FIG. 7G, in the region of the base of the elastic elements 14, the conducting lines 122 form a base for the solder bumps 12 that are to be formed during the following processing steps. The conducting lines 122 can be used as "under bump metallization" (UBM). Alternatively, additional UBM-layers (not shown in FIG. 7G) may be applied over the base of the conducting lines 122 to prevent diffusion, oxidation and other chemical processes in the interface region of the solder bumps 12 and the conducting lines 122. The UBM may consist of a conducting adhesion layer, a conducting wetting layer and/or a conducting oxidation barrier layer.

FIG. 7G further discloses solder stop layer 126, an insulating layer with openings in the solder bump base regions applied over the conducting layer 122. Solder stop layer 126 may be of polymers, like polyimide, epoxies, BCB, PBOs or other known dielectric materials, having a thickness of typically a few micrometers. Solder stop layer 126 prevents solder material from expanding laterally over the surface of the redistribution layer when applying solder material, e.g. Pb/Sn, over the conducting lines. Solder stop layer 126 further helps to insulate the conducting lines against electrical contact with the outside of the semiconductor device.

FIG. 7G further discloses solder bump 12 formed on top of conducting line 122 over elastic element 14. It is preferred that solder bump 12 and elastic element 14 are centered around the same axis to provide the solder bumps 12 with the highest mechanical flexibility possible with respect to the molded body 3.

Figure 7H:
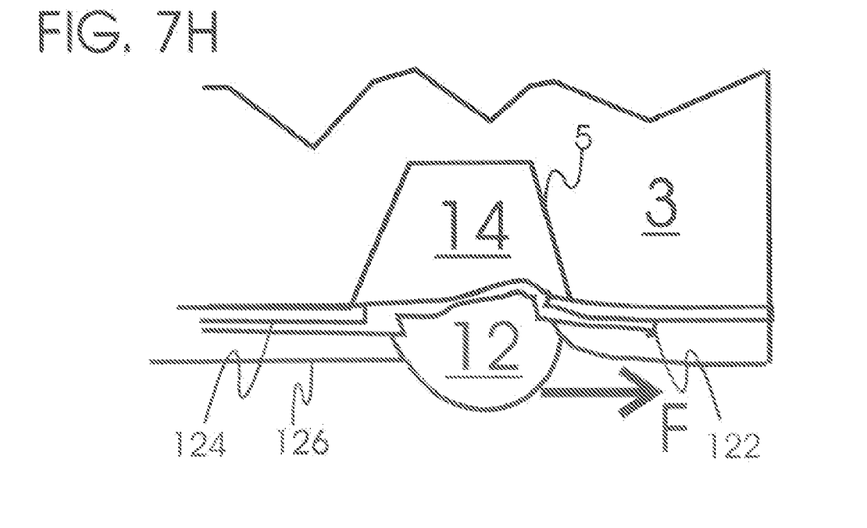

FIG. 7H schematically discloses the way in which elastic element 14 helps absorbing shear forces F acting on the solder bump. Due to the ability of the elastic elements 14 to deform under pressure, rigid solder bump 12 can intrude into the original volume of the elastic elements 14 to be bent into the direction of the shear force. This way, the force necessary to break a solder bump from the molded body cannot build up as easily as in the absence of the elastic elements 14. Note that the conducting lines 122, and the insulation layer 124, due to their thin layer structures, are flexible enough to adjust to the deformation that the shear force F is causing to the elastic elements 14.

FIGS. 8A to 8H schematically disclose a further embodiment of a method of manufacturing a semiconductor device. In many ways, the method is the same as explained in the embodiment of FIGS. 7A to 7F. Therefore, for the same features in the drawings, the same labeling is used. However, different from FIGS. 7A to 7F, recesses 5 and elastic elements 14 are formed in molded body 3 after the semiconductor chips 2 have been molded.

Figure 8A:
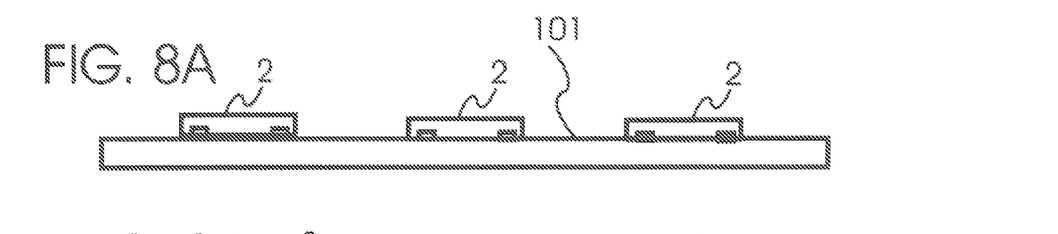
FIGS. 8A to 8G schematically disclose a further embodiment of a method of manufacturing semiconductor devices wherein elastic elements are formed after forming of a molded body.
Figure 8B:
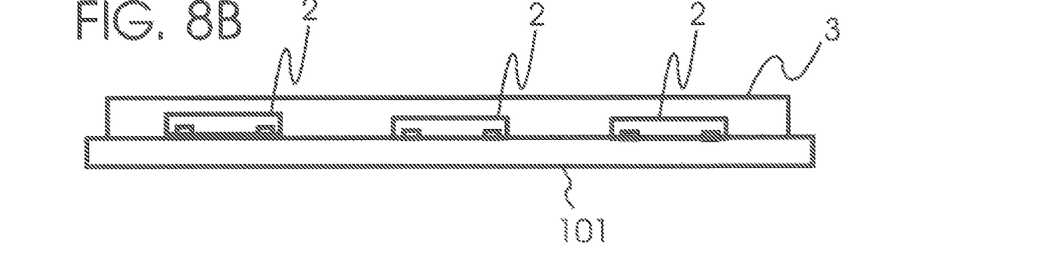
Figure 8C:
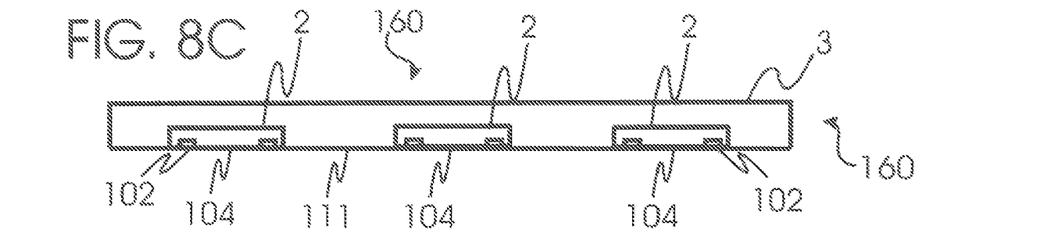

FIG. 8A corresponds to FIG. 7B with the exception that no elastic elements 14 are placed on carrier 101. FIG. 8B corresponds to FIG. 7C. As described for FIG. 7C, molding material is applied over the semiconductor chips 2 to form molded body 3. FIG. 8C discloses molded body 3 after the carrier has been removed from molded body 3, as described for FIG. 7D. After removal, semiconductor chips 2 and molded body 3 form a reconstituted wafer 160 with the first main faces 104 of semiconductor chips 2 exposed to the outside. The exposed first main faces 104 form a coplanar plane 111 with molded body 3.

Figure 8D:
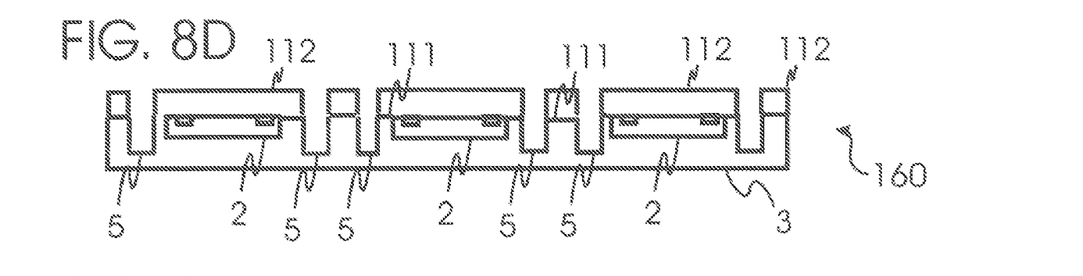

FIG. 8D schematically discloses molded body 3 after recesses 5, or holes, have been etched selectively to a photo-lithographically structured mask 112 into molded body 3, on coplanar plane 111. The diameters and depths of the recesses 5, depending on the application, are comparable to the geometry of the elastic elements 14 that are to be formed in the recesses 5.

Figure 8E:
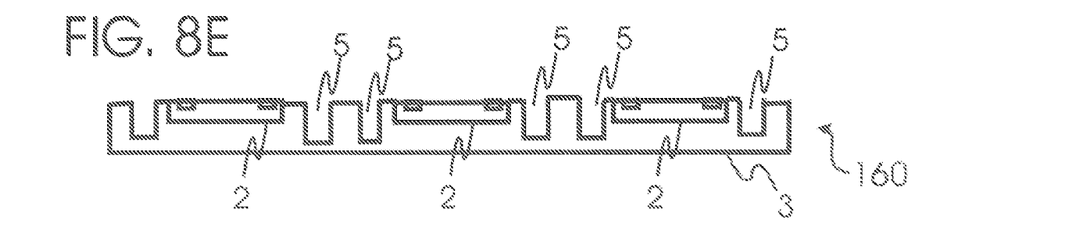

FIG. 8E schematically discloses molded body 3 of FIG. 8D after removal of mask 112. Remaining molded body 3 represent a reconstituted wafer 160 with recesses 5 ready to be filled with elastic material 14a.

Figure 8F:
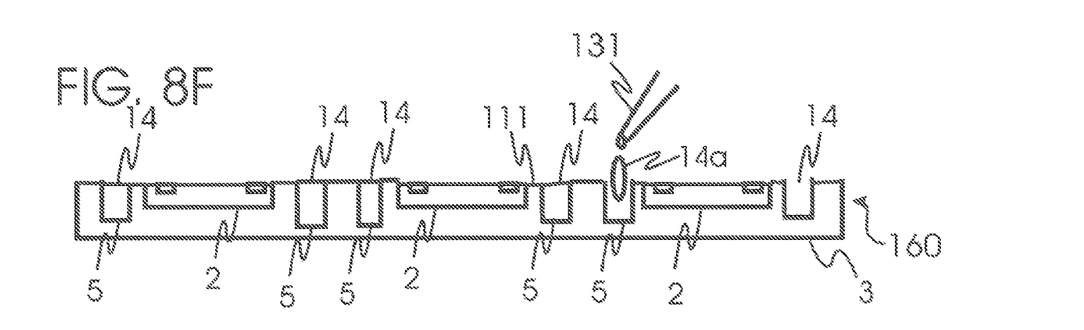

There are several options for filling the recesses with elastic material. FIG. 8F discloses one embodiment wherein elastic material 14a (e.g. silicone or any other elastomer, thermoplastic or thermosetting material) is selectively dispensed into the recesses 5 by a dispensing tool 131 in a standard ink jet process. After filling the recesses with the elastic material 14a, the elastic material is usually heated, e.g. at 180° C., or radiated to solidify and to adhere to the recess walls. A silicone material known in the art is, e.g., Elastosil™ by Wacker Company.

Alternatively, elastic material 14a may be filled into the recesses 5 by applying the elastic material selectively to the photo-lithographically structured mask 112 (see FIG. 8D), or selectively to a template (screen printing) that has its openings aligned to the recesses 5. After application of the selective material 14a, the mask or template are removed to leave only the recesses 5 covered with elastic material 14a (see FIG. 8F). After solidification, the elastic material 14a turns into elastic elements 14. Note that in FIG. 8F, the shape of the elastic elements 14 is that of a column, conforming to the shape of the recesses 5 etched in molded body 3.

Figure 8G:
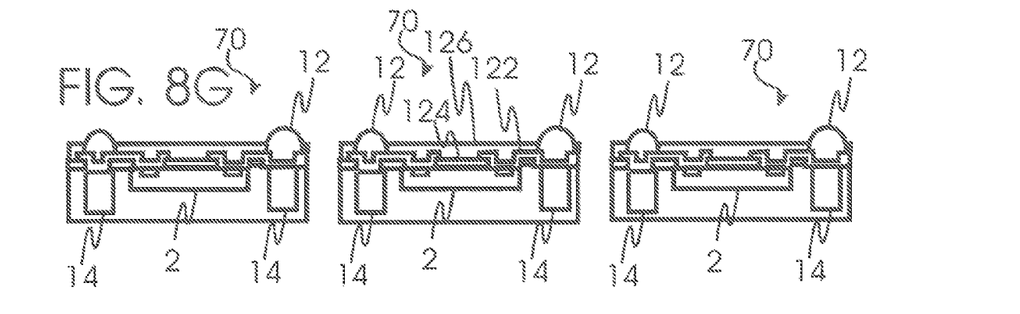

The processing steps following the structuring of the elastic elements 14 are identical to the ones shown in FIGS. 7E and 7F. FIG. 8G schematically discloses reconstituted wafer 160 of FIG. 8F after a redistribution layer (comprised of insulation layer 124, conducting layer 122, and solder stop layer 126) has been applied over the coplanar plane 111, after solder bumps 12 have been applied over the elastic elements 14, and after the reconstituted wafer has been sawn into separated semiconductor devices 70.

FIGS. 9A to 9F schematically disclose a further embodiment of a method of manufacturing semiconductor devices. In many ways, the method is the same as explained in the embodiment of FIGS. 7A to 7F. However, different from FIGS. 7A to 7F, recesses 5 are formed in molded body 3 by means of a carrier 101 that comprises protrusions 144 that protrude from the surface on which the molding material is to be applied. In FIGS. 9A to 9F, the protrusions 144 are conically shaped in order to form cone-shaped recesses in the molded body 3 when applying molding material over carrier (see FIG. 9B). It is obvious from the previous discussions, however, that the shape of the protrusions 144 can be of other geometries as well, e.g. column-like shaped, truncated cone-shaped, cubical, etc.

The protrusions 144 may be part of the double-sided sticky tape that was used in the description of FIGS. 7A-7F. In this case, it is easy to remove the molded body 3 from the tape despite the protrusions 144, due to the thermo-releasable properties of the tape. Alternatively, the protrusions 144 may be part of a mold form in which the semiconductor chips 2 are molded.

Figure 9A:
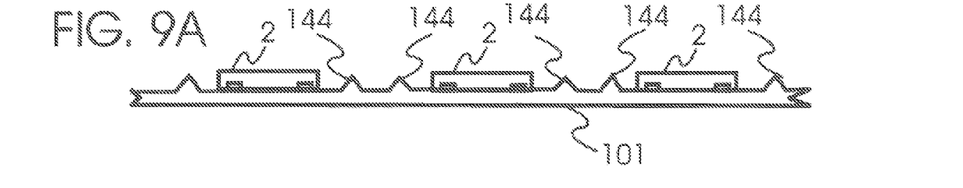
FIGS. 9A to 9E schematically disclose a further embodiment of a method of manufacturing semiconductor devices wherein recesses are formed in the molded body during molding.
Figure 9B:
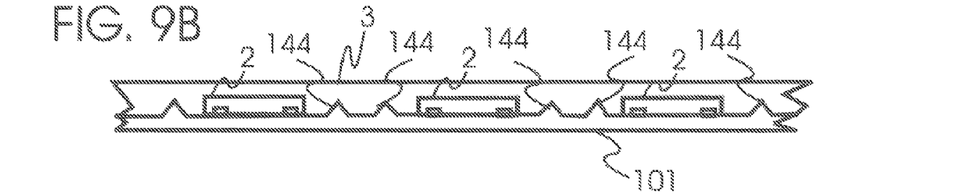

FIG. 9B discloses the semiconductor chips 2 after having been molded in molded body 3. In this embodiment, like in the previous embodiments, the mold form that has formed the molded body 3 has a cavity of a semiconductor wafer shape, i.e. a height of typically a few hundred micrometers, and a diameter of, say, 200 mm or 300 mm. This way, a reconstituted wafer consisting of semiconductor chips 2 embedded in a molding material matrix can be formed.

Figure 9C:
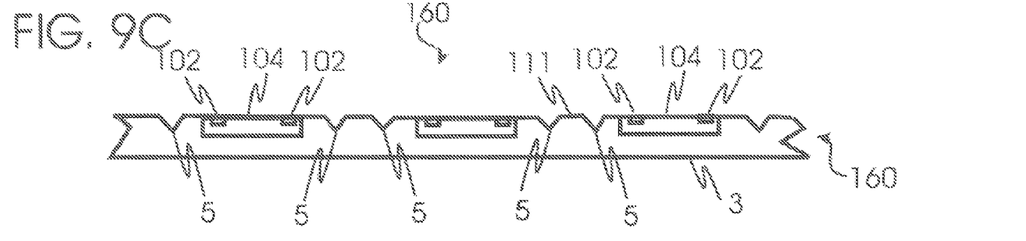

FIG. 9C discloses molded body 3 after having been removed from carrier 101 to become a reconstituted wafer 160. In the case of the carrier 101 being a thermo-releasable tape, molded body 3 has been removed from the carrier 101 by a heating procedure. Like in the previous embodiments, reconstituted wafer 160 consists of the molded body 3 and semiconductor chips 2 whose first main faces 104 and connection elements 102 are exposed to the outside. Further, first main faces 104 and molded body 3 form a coplanar plane 111, interrupted solely by the cone-shaped recesses 5.

Figure 9D:
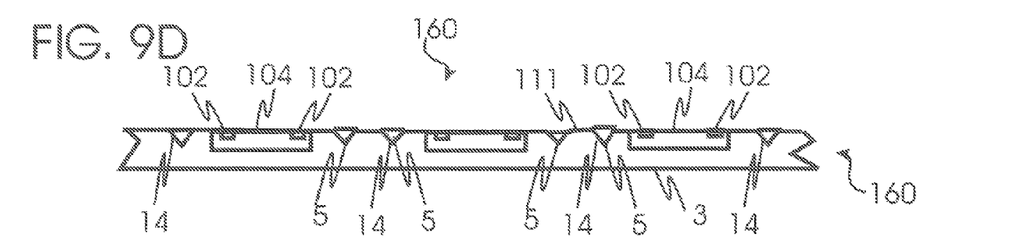

FIG. 9D discloses reconstituted wafer 160 after having filled the recesses 5 with elastic material to obtain elastic elements 14 in the recesses 5. The filling of the recesses 5 with elastic material can be done in the same way as described in the embodiment of FIGS. 8A to 8G. Again, the elastic material may be silicone or any other elastomer, thermoplastic or thermosetting materials.

Figure 9E:
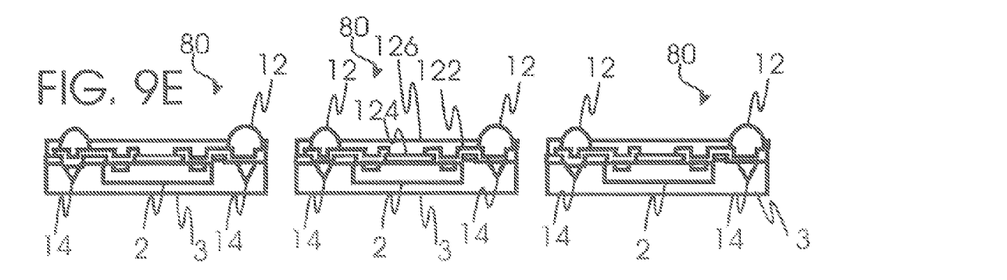

The processing steps following the structuring of the elastic elements 14 are identical to the ones shown in FIGS. 7E and 7F, and FIGS. 8F and 8G. FIG. 9E schematically discloses molded body 3 of FIG. 9D after a redistribution layer (comprised of insulation layer 124, conducting layer 122, and solder stop layer 126) has been applied over coplanar plane 111, after solder bumps 12 have been applied over the elastic elements 14, and after reconstituted wafer 160 has been sawn to become multiple separated semiconductor devices 80.

What is claimed is:

1. A semiconductor device comprising:
    a semiconductor chip;
    a molded body covering the semiconductor chip, the molded body comprising an array of recesses in a first surface of the molded body;
    first contact elements; and
    elastic elements in the recesses that connect the first contact elements with the molded body, the elastic elements directly contacting the molded body.

2. The semiconductor device according to claim 1, wherein each first contact element comprises a solder bump.

3. The semiconductor device according to claim 1, further comprising:
    second contact elements rigidly connected to the semiconductor chip.

4. The semiconductor device according to claim 3, wherein the first contact elements and the second contact elements define a common plane for mounting the semiconductor device to a carrier.

5. The semiconductor device according to claim 1, wherein each elastic element is form-fit to the shape of its respective recess.

6. The semiconductor device according to claim 1, wherein the elastic elements have an elastic module of less than 50 MPa.

7. The semiconductor device according to claim 1, further comprising:
    conducting lines for electrically connecting the semiconductor chip to the first contact elements.

8. The semiconductor device according to claim 7, wherein the conducting lines extend over the semiconductor chip and the molded body.

9. The semiconductor device according to claim 1, wherein the first contact elements comprise at least one of solder bumps, stud bumps, pads, posts, pillars, conductive paste balls, paste bumps, coated polymer balls, and electrically conducting protrusions.

10. A semiconductor device comprising:
    a semiconductor chip comprising connection elements on a first main face of the semiconductor chip;
    a molded body covering the semiconductor chip, the molded body comprising multiple recesses;
    elastic elements in the recesses, the elastic elements directly contacting the molded body;
    first contact elements connected to the elastic elements; and
    conducting lines applied over the semiconductor chip and a surface of the molded body, the conducting lines electrically connecting the first contact elements with the connection elements.

11. The semiconductor device according to claim 10, wherein each of the first contact elements is a solder bump.

12. The semiconductor device according to claim 1, wherein the elastic elements comprise one of silicone and foam.

13. The semiconductor device according to claim 1, wherein the elastic elements have one of a truncated cone shape, a column shape, and a cubical shape.

14. The semiconductor device according to claim 10, wherein the elastic elements comprise one of silicone and foam.

15. The semiconductor device according to claim 10, wherein the elastic elements have one of a truncated cone shape, a column shape, and a cubical shape.

16. A semiconductor device comprising:
    a semiconductor chip;
    a molded body covering the semiconductor chip, the molded body comprising an array of recesses in a first surface of the molded body;
    an elastic element in each recess directly contacting the molded body and form-fit to the shape of the respective recess, each elastic element having a surface coplanar with the first surface of the molded body; and
    a first contact element connected to each elastic element.

17. The semiconductor device according to claim 16, further comprising:
    conducting lines electrically coupling the semiconductor chip to each first contact element, the conducting lines extending over the semiconductor chip and directly contacting the first surface of the molded body.

18. The semiconductor device according to claim 16, further comprising:
    second contact elements rigidly connected to the molded body.

19. The semiconductor device according to claim 16, wherein the elastic elements comprise one of silicone and foam.

20. The semiconductor device according to claim 16, wherein the elastic elements have one of a truncated cone shape, a column shape, and a cubical shape.

* * * * *